(12) United States Patent
Zhang et al.

(10) Patent No.: US 9,870,999 B2
(45) Date of Patent: Jan. 16, 2018

(54) DEVICE AND METHOD FOR ALIGNMENT OF VERTICALLY STACKED WAFERS AND DIE

(71) Applicant: STMicroelectronics, Inc., Coppell, TX (US)

(72) Inventors: John H. Zhang, Altamont, NY (US); Walter Kleemeier, Saratoga Springs, NY (US); Paul Ferreira, Barraux (FR); Ronald K. Sampson, Lagrangeville, NY (US)

(73) Assignee: STMICROELECTRONICS, INC., Carrollton, TX (US)

( * ) Notice: Subject to any disclaimer, the term of this patent is extended or adjusted under 35 U.S.C. 154(b) by 0 days.

(21) Appl. No.: 14/951,050

(22) Filed: Nov. 24, 2015

(65) Prior Publication Data

US 2016/0079131 A1    Mar. 17, 2016

Related U.S. Application Data

(60) Division of application No. 14/038,574, filed on Sep. 26, 2013, now Pat. No. 9,324,660, which is a
(Continued)

(51) Int. Cl.
*H01L 23/544* (2006.01)
*H01L 21/66* (2006.01)
(Continued)

(52) U.S. Cl.
CPC ............ *H01L 23/544* (2013.01); *H01L 22/14* (2013.01); *H01L 22/22* (2013.01); *H01L 22/34* (2013.01); *H01L 25/0657* (2013.01); *H01L 25/50* (2013.01); *H01L 2223/5446* (2013.01); *H01L 2223/54426* (2013.01); *H01L 2223/54453* (2013.01); *H01L 2224/16* (2013.01);
(Continued)

(58) Field of Classification Search
CPC ..... H01L 23/481; H01L 22/34; H01L 23/544; H01L 22/14; H01L 25/0657; H01L 25/50
See application file for complete search history.

(56) References Cited

U.S. PATENT DOCUMENTS 7,193,423 B1    3/2007  Dalton et al.
7,514,276 B1 *  4/2009  Yearous .................. H01L 22/14
                                                          257/E21.511
(Continued)

OTHER PUBLICATIONS

3D Wafer-Level Packaging (3D-WLP), URL=http://www.imec.be/ScientificReport/SR2007/html/1384073.html, download date Oct. 23, 2009.
(Continued)

*Primary Examiner* — Julia Slutsker
(74) *Attorney, Agent, or Firm* — Seed IP Law Group LLP

(57) ABSTRACT

A device is provided that includes a first die having a first alignment structure that includes a plurality of first transmission columns arranged in a pattern and a second die positioned on the first die, the second die having a second alignment structure that includes a plurality of second transmission columns arranged in the same pattern as the first transmission columns. The first and second transmission columns are each coplanar with a first surface and a second surface of the first and second die, respectively.

23 Claims, 14 Drawing Sheets

Related U.S. Application Data continuation of application No. 12/650,372, filed on Dec. 30, 2009, now Pat. No. 8,569,899.

(51) Int. Cl.
    *H01L 25/065*      (2006.01)
    *H01L 25/00*      (2006.01)

(52) U.S. Cl.
    CPC ............ *H01L 2225/06513* (2013.01); *H01L 2225/06541* (2013.01); *H01L 2225/06593* (2013.01); *H01L 2924/1461* (2013.01)

(56) References Cited

U.S. PATENT DOCUMENTS

| | | | |
|---|---|---|---|
| 7,808,075 | B1 | 10/2010 | Cheng et al. |
| 2003/0062611 | A1 | 4/2003 | Shibata |
| 2004/0018654 | A1 | 1/2004 | Drost et al. |
| 2005/0161837 | A1* | 7/2005 | Matsui .................. H01L 23/481 257/797 |
| 2006/0121690 | A1 | 6/2006 | Pogge et al. |
| 2009/0085183 | A1 | 4/2009 | Mitchell et al. |
| 2009/0215207 | A1* | 8/2009 | Rousseau .............. H01L 23/645 438/17 |
| 2010/0266295 | A1* | 10/2010 | Zheng .................. H04B 10/801 398/201 |
| 2012/0126230 | A1 | 5/2012 | Fournel et al. |

OTHER PUBLICATIONS

Farrens, S. et al., "Bonding Solutions for 3D Integration," Advanced Packaging 17(3):29-32, 2008.

Lu, J.-Q. et al., "Wafer-Level Assembly of Heterogeneous Technologies," in 2003 International Conference on Compound Semiconductor Manufacturing Technology, GaAsMantech, Scottsdale, Arizona, May 19-22, 2003, pp. 91-94.

Lu, J.-Q. et al., "Planarization Issues in Wafer-Level Three-Dimensional (3D) Integration," MRS Symposium Proceedings, Advances in Chemical-Mechanical Polishing vol. 816, Materials Research Society, Spring 2004, pp. K7.7.1-K7.7.12.

Lu, J.-Q. et al., "Die-on Wafer and Wafer-Level Three Dimensional (3D) Integration of Heterogeneous IC Technologies for RF-Microwave-Millimeter Applications," MRS Symposium Proceedings, Materials, Integration and Packaging Issues for High-Frequency Devices II vol. 833, Materials Research Society, Fall 2004, pp. G6.8.1-G6.8.6.

Matthias, Thorsten et al., "3D Process Integration—Wafer-to-Wafer and Chip-to-Wafer Bonding," MRS Symposium Proceedings, Enabling Technologies for 3-D Integration vol. 970, Materials Research Society, Fall 2006, pp. 970-Y04-970-Y08.

* cited by examiner

DEVICE AND METHOD FOR ALIGNMENT OF VERTICALLY STACKED WAFERS AND DIE

BACKGROUND

Technical Field

The present disclosure relates to alignment structures formed on a plurality of wafers configured to be aligned to form a multichip stack in a single package.

Description of the Related Art

As consumer demand increases for smaller multifunction devices, manufacturers face significant challenges to integrate different semiconductor technologies on a single die. Multichip packages have become increasingly popular to increase device density and to combine traditionally incompatible technologies, such as logic, memory, and microelectromechanical systems (MEMS). For example, as cell phones morph into personal entertainment systems, manufacturers look for ways to integrate multiple technologies, like SRAM, DRAM, flash, logic, analog, and radio frequency, into one relatively thin package.

Multichip packages also address some of the limitations that have arisen with respect to two-dimensional scaling. The multichip packages may be aligned and bonded at the wafer level or as individual die. Each of the die to be included in a multichip package may be formed on a single wafer dedicated to a particular technology. For example, one die may be manufactured to be a processor that is configured to be packaged with a MEMS sensor, which is separately manufactured on another wafer.

These vertically stacked chips formed from multiple die offer improved density and performance. The challenges to integrate traditionally incompatible processes on a single wafer are avoided by forming incompatible technologies on individual wafers and packaging them in the single package.

FIG. 1 is a vertical stack 10 of six wafers 12a-12f aligned and bonded according to a known method of alignment. Each wafer 12a-12f is formed independently from the other wafers to have a plurality of through silicon vias (TSVs) 14 in similar locations. After the processing to form a plurality of die on the wafers 12a-12f is complete, the wafers 12a-12f are thinned to approximately 70 microns. The thinning reduces the size and weight of the final vertically stacked multi-chip package.

The TSVs 14 can be used for alignment and to form electrical communications between wafers. The TSVs 14 may be formed by deep reactive ion etching before or after the wafers 12a-12f are thinned. Typically, the TSVs are formed after the devices are formed on the wafers. The TSVs 14 in FIG. 1 are annular metal TSVs that are shown in cross-section as two vertical pillars 16 through each wafer 12a-12f. A top pad 18 and a bottom pad 20 are formed on a top and bottom surface of each wafer 12a-12f after the wafer is thinned. The top and bottom pads 18 and 20 are solder interconnects that electrically connect the TSVs 14 of the wafers 12a-12f.

The wafers 12a-12f in FIG. 1 are not accurately aligned. For example, the annular TSVs 14 are all formed to have the same diameter. In the cross-section of FIG. 1, a width between each pillar 16 of each TSV 14 varies from wafer to wafer. More particularly, the width between the pillars 16 of the TSVs 14 of wafer 12a is smaller than the width between the pillars 16 of wafer 12b. This variation in width indicates that the TSVs 14 of each wafer 12a-12f are not aligned.

Alignment is achieved when the top pads 18 are in contact with respective bottom pads 20 of an adjacent wafer. The inaccuracy of this method of alignment is also shown by considering a central axis 22 of each annular TSV 14. If the wafers 12a-12f were accurately aligned, the central axis 22 of each annular TSV 14 would align. Clearly, the central axes 22 of the TSVs 14 are shifted with respect to each other. This imprecise alignment affects electrical communication between the chips and impacts the reliability of device performance.

BRIEF SUMMARY

The present disclosure is directed to alignment structures that enable precise alignment of a plurality of wafers or individual die to be aligned and bonded to form a multichip package. The alignment structures are a plurality of electrically or optically conductive columns that extend completely through the die or wafer, from a top surface to a bottom surface. The columns are formed in selected patterns that can vary in the number of columns in the pattern and location of the columns with respect to each other.

Precise alignment of the plurality of wafers or individual die is achieved by automated equipment that determines when the patterns of adjacent wafers are accurately aligned. When the patterns are aligned, the equipment will detect a signal through both wafers through each of the columns in the pattern.

For example, a first die and a second die may have a pattern of columns formed at a respective corner of each die. If the first and second die are roughly positioned where some of the columns of the first die are aligned with respective columns on the second die, the equipment will detect some amount of the signal passing through the columns of the first and second die. Accordingly, the equipment will make small adjustments to achieve more precise alignment.

Alternatively, if the first die is incorrectly positioned with respect to the second die, such that no columns of the pattern are overlying each other, the equipment will not detect the signal. A larger movement will be made to align the columns. If some of the columns are not transmitting the signal, the equipment will sense the columns that are not aligned and make some movement to achieve more precise alignment.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

DETAILED DESCRIPTION

Figure 1:
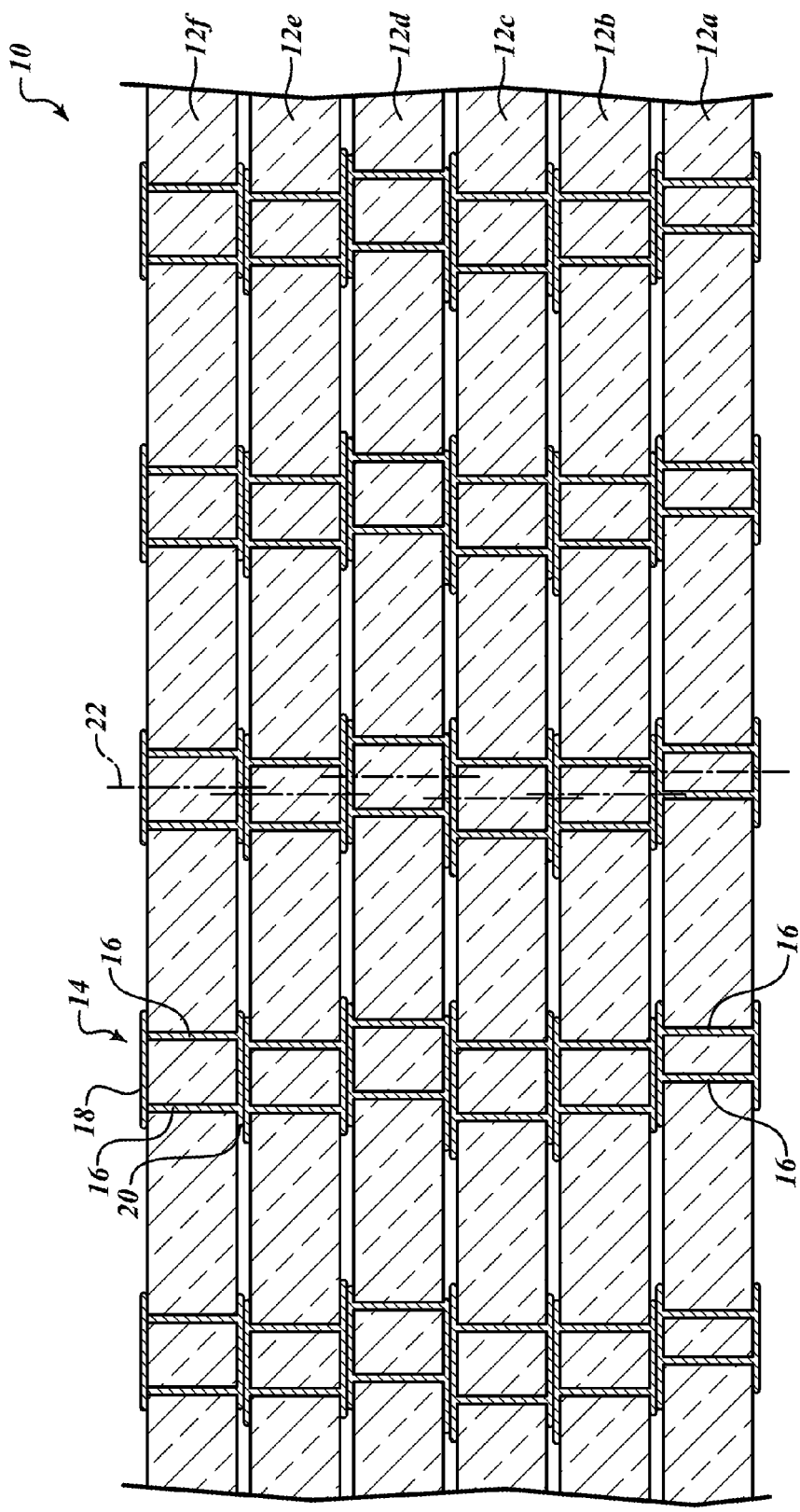
FIG. 1 is a cross-sectional view of a vertically stacked wafer level stack using through silicon vias for alignment.

In the following description, certain specific details are set forth in order to provide a thorough understanding of various embodiments of the disclosure. However, one skilled in the art will understand that the disclosure may be practiced without these specific details. In some instances, well-known structures associated with the manufacturing of semiconductor wafers have not been described in detail to avoid obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the drawings, identical reference numbers identify similar features or elements. The size and relative positions of features in the drawings are not necessarily drawn to scale.

Vertically stacking wafers or die to form multichip packages offers manufacturers advantages over traditional single chip packages. The processes to manufacture a single die to include multiple devices are more complex and time consuming than preparing a single die to have one type of device. Vertically stacked chips can combine mixed signal technologies, such as wireless and optical; MEMS, such as microfluidics and sensors; and logic. Many of these technologies have enhanced properties when formed from specific semiconductor materials that have different lattice structures, such as silicon, gallium arsenide, and indium phosphide. Integrating technologies formed with different lattice structures can result in disadvantageous lattice mismatch and problems with device reliability.

Vertically stacked multichip devices formed from a plurality of independently processed wafers avoid problems from lattice mismatch and other process incompatibilities. The individual processing of homogeneous technologies on single wafers improves performance, functionality, and increases density.

The accuracy of alignment between the wafers or die to be bonded impacts the manufacturer's ability to produce reliable vertically stacked devices. The size and pitch of the alignment structures are factors in accurately aligning wafers or die.

Figures 2A, 2B:
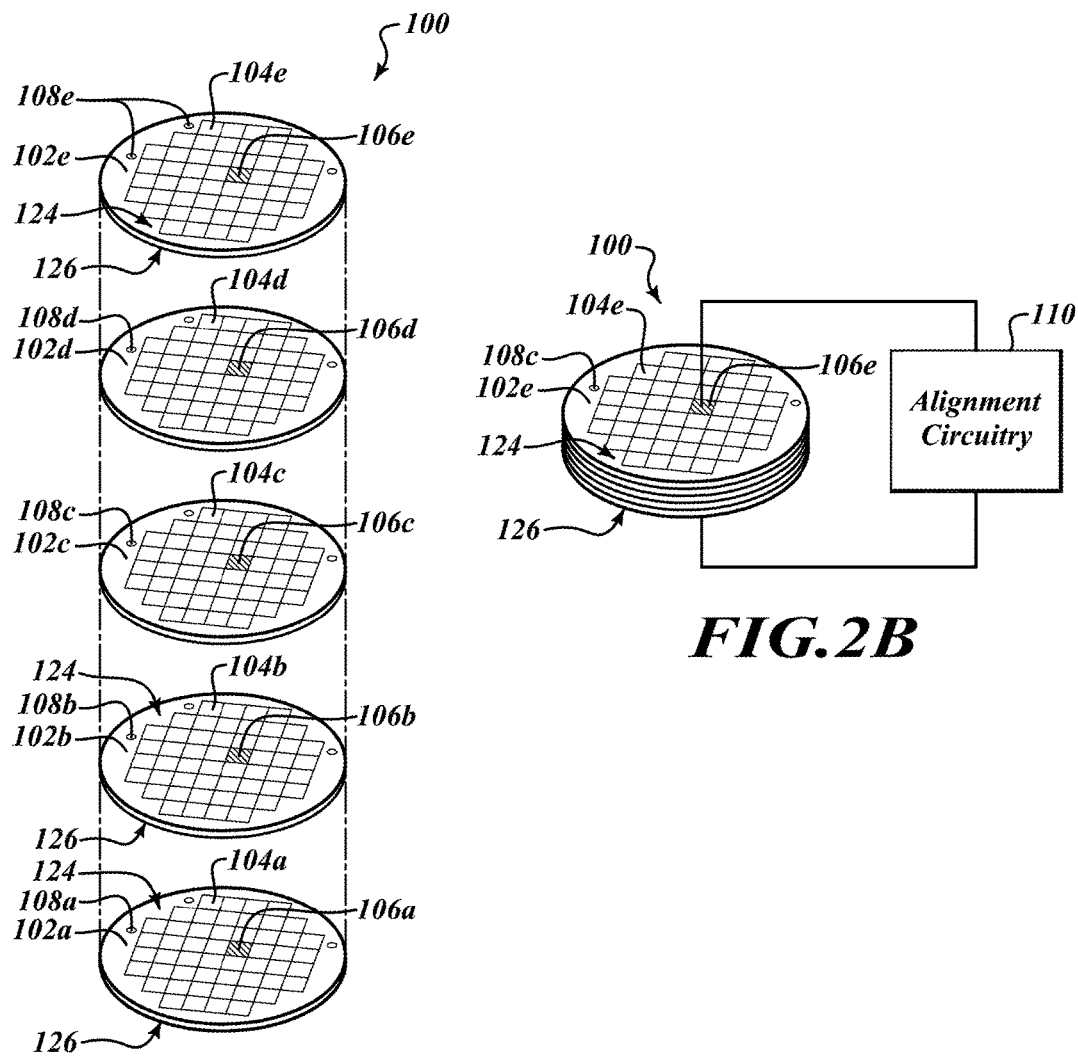
FIG. 2A is an isometric view of a plurality of wafers to be aligned according to an embodiment of the present disclosure.
FIG. 2B is a schematic view of the wafers of FIG. 2A after being aligned.

FIGS. 2A and 2B show a method of aligning a plurality of wafers 102a-102e to form a vertical stack 100 with alignment circuitry 110. The wafers 102a-102e may have a plurality of alignment structures 106a-106e in a single alignment die, in a plurality of alignment die, or spaced intermittently at a plurality of locations on the wafers. It may have course alignment structures 108a-108e and fine alignment structures 106a-106e. For example, the alignment structures 106 and 108 may be formed in a kerf region between die, within each die, or within a select number of the die. For ease of illustration, a single fine alignment die 106a-106e is illustrated on each wafer 102a-102e. The details and variations on the alignment die and the alignment structures will be described in more detail below.

Each wafer includes a plurality of die 104a-104e that are manufactured to have specific device characteristics designed to interact with other die vertically stacked in a multichip single package. The first wafer 102a may be a processor or an application specific integrated circuit (ASIC) that is configured to interact with sensors formed on the fourth wafer 102d. The processor of the first wafer 102a may be coupled to memory formed on the second and third wafers 102b and 102c to store information received from the sensors. A radio frequency transmitter and receiver may be formed on the fifth wafer 102e that is configured to send information stored in the memory and receive commands from an external controller.

Each of the wafers 102a-102e are formed independently from each other. Manufacturers may utilize existing semiconductor processing equipment and techniques to form each of the wafers 102a-102e. In one embodiment, one or more of the wafers 102a-102e are made of different materials from each other. By processing incompatible technologies independently, the processing time per individual wafer may be significantly reduced and result in higher yields per wafer. Processing the wafers individually also reduces complexity and reduces the number of steps. Individual wafers 102a-102e may be processed in different fabrication locations by different producers. This will enable higher throughput, enhanced cleanliness, and flexibility in processing for each wafer. These alignment structures allow standard fabrication equipment to be used instead of requiring a manufacturer to invest in additional equipment.

The alignment circuitry 110 in FIG. 2B is coupled to the plurality of alignment structures 106e that extend from a first surface 124 of the wafer 102e and also to the plurality of alignment structures 106a that extend from a second surface 126 of the wafer 102a. In one embodiment, each alignment structure 106 includes a plurality of transmission columns 112 formed in a pattern through each wafer 102. During the design process, the manufacturer of the stacked die package determines where and in what pattern to form the alignment structures on each wafer so that after manufacturing, the wafers or dies can be accurately aligned and bonded.

The alignment circuitry 110 may be included in alignment equipment configured to send test signals and adjust the relative positions the wafers 102a-102e based on the test signals to achieve precise alignment. A person may also move the wafers relative to each other to achieve proper alignment while looking at the output of the test signals, or, alternatively, it can be done 100% by computer control, motor drives, and feedback circuits. In one embodiment, the alignment equipment aligns two wafers 102a and 102b by aligning a plurality of gross alignment structures 108a and 108b. Subsequently, the alignment circuitry couples a probe to the alignment structures 106b that extends from the first surface 124 of the wafer 102b and another probe to the alignment structures 106a that extends from the second surface 126 of the wafer 102a.

By using the gross alignment structures, the wafers 102a and 102b are initially correctly oriented with respect to each other. After the alignment circuitry 110 makes contact with the alignment structures of each wafer, the alignment circuitry 110 sends the signal from the probe through the plurality of transmission columns 112 of the alignment structure 106b of the wafer 102b. If none of the corresponding transmission columns 112 of the wafer 102a are in contact with the transmission columns 112 of the wafer 102b, then no signal will be received at the second surface 126 of the wafer 102a. The alignment circuitry then adjusts the position of the wafers with respect to each other and resends the signal until the signal is received through each transmission column of each wafer 102a.

Once some of the signal is transmitted from the probe through both wafers 102a and 102b, the alignment circuitry can determine which ones of the transmission columns are transmitting the signal through both wafers. The alignment circuitry is configured to extrapolate adjustments to make in order to have each of the transmission columns of the wafer 102b aligned and transmitting the signal through the related transmission columns of the wafer 102a. The manufacturer may develop patterns that assist the alignment circuitry in determining how to adjust the wafers to achieve alignment.

For electrically conductive transmission columns 112, alignment may be achieved by applying a current to the first surface 124 of the wafer 102b and detecting an amount of that current at the second surface 126 of the wafer 102a. The current detected at the second surface 126 of the wafer 102a will be the greatest when the first and second ends 118 and 120 of the two wafers 102a and 102b are aligned. Once the first and second wafers 102a and 102b are aligned, the alignment process may be repeated by positioning the third wafer 102c on the vertically stacked wafers, then wafer 102d, and so forth.

In one embodiment, the transmission columns are electrically conductive and have a known electrical resistance. The resistance is sufficient to be some detectable value and may be in the range of 5-10 ohms. The alignment circuitry 110 transmits the current through the grossly aligned wafers and detects the resistance through the transmission column of a number of stacked wafers.

In the simple case of aligning the first and second wafers 102a and 102b, consider the alignment structure to have three transmission columns arranged in a pattern. The probe will transmit the signal through all three ends on the first surface 124 of the wafer 102b. The second probe will then detect the resistance through the three transmission columns. If two of the three transmission columns are aligned in some way, the second probe will detect a resistance. If the third transmission column of the second wafer 102b is not aligned with the corresponding transmission column of the first wafer 102a, the second probe will not detect the signal. The alignment circuitry will make slight movements of the second wafer with respect to the first wafer to align the third transmission column. The alignment circuitry may be programmed to know the pattern of the transmission columns to better extrapolate what movements to make to precisely align the wafers. When all three of the transmission columns are aligned, the resistance will be at a minimum.

In another embodiment, instead of detecting the individual resistance, the probe of the alignment circuitry 110 will transmit the signal through all three transmission columns on the second wafer 102b. The second probe detects an overall resistance through the transmission columns. If one of the transmission columns is not aligned, the resistance will be higher than if all of the transmission columns are aligned. Slight or minor adjustments may be made by the alignment circuitry to place the transmission columns in accurate alignment.

In another embodiment, the three transmission columns are formed as parallel resistors. A pad may be formed to electrically communicate with the ends of each of the three transmission columns. The pad may be formed during the manufacturing process or the pad may be applied as a component of the probe. The alignment circuitry will transmit a current thought the pad and through each of the three transmission columns. Instead of determining the individual resistance through each column, the alignment circuitry evaluates the parallel resistance of all three.

As is known, if resistors are in parallel, the total resistance is reduced. The well-known equation for parallel resistance may be used to determine how many of the resistors are properly aligned, $$R_{equivalent} = \frac{1}{R_1} + \frac{1}{R_2} + \frac{1}{R_3} \dots \frac{1}{R_n}.$$

If the resistors $R_1$-$R_n$ all have equal value, then it can be measured exactly how many are properly aligned by measuring the total resistance at large pads on each wafer or die. Alternatively, each resistor may have a different value and they may vary from each other by factors of 2, 5, or 10. In this way, a measure of total resistance will provide information regarding the exact current alignment and also which resistors are not yet aligned. This will provide information regarding how much and in what direction to move the wafers relative to each other to obtain proper alignment.

In an alternative embodiment where the transmission columns are optically conductive, the alignment circuitry 110 may be configured to detect an intensity of optical light that passes through the transmission columns of the alignment die 106. The alignment circuitry positions a light source overlying the ends of the transmission columns on the top wafer, such as wafer 102b. A light detector is positioned on the second surface of the last wafer, such as 102a. Precise alignment is achieved when an intensity of light detected is at a maximum. Optically conductive transmission columns may be in direct contact with the respective transmission columns or the ends of related columns may be spaced by some distance, as described with respect to FIG. 3C, explained later herein.

Figure 11:
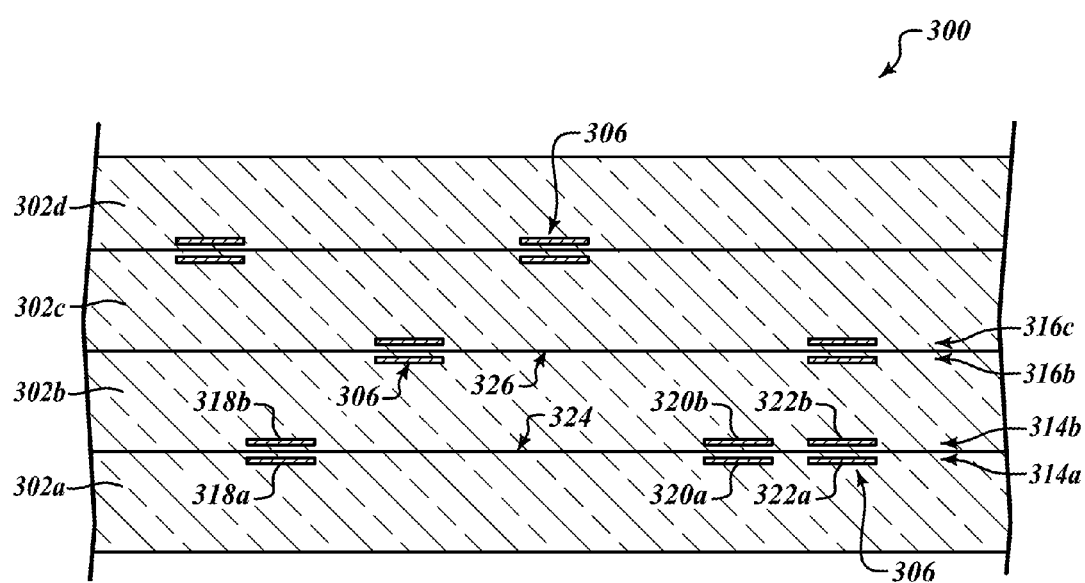
FIG. 11 is a cross-sectional view of capacitive alignment structures formed on a plurality of wafers in accordance with another embodiment of the present disclosure.

In yet another embodiment, the alignment structures may be formed as metal plates adjacent the top and bottom surface of each wafer. As shown in FIG. 11, the wafers are formed having the specific patterns of capacitive alignment structures. The alignment circuitry is configured to adjust the wafers with respect to each other to achieve a maximum capacitance between capacitive plates of the individual alignment structures. The wafers are first initially roughly aligned such that the plates of the capacitive alignment structures are partially overlapping. The alignment circuitry associated with each individual alignment structure may be activated at different times to enhance the precision of alignment.

For example, if the plates of the associated alignment structures are partially aligned, such that the first plate is shifted to the right with respect to the second plate, the alignment circuitry will detect a first capacitance. The alignment circuitry may shift the first plate further to the right and detect a second capacitance that will be smaller than the first capacitance. Since the capacitive value is lower, the alignment circuitry may shift the first plate back to the left by an amount equal to the first shift and by an additional amount. A third capacitance will be larger than the first capacitance because more area of the plates will be aligned.

The alignment process may be automated, such that a robotic arm or other wafer transportation device places the second wafer 102b overlying the first wafer 102a in rough alignment. Mechanical adjustment devices or robotic arms may be incorporated with the alignment circuitry to automatically make the slight adjustments to align the wafers. A processor and memory may be associated with the alignment circuitry and the mechanical arms to store information about the type of alignment structure and the particular patterns that are associated with a single wafer or a batch of wafers. A single wafer may include both optical and electrical transmission columns and capacitive alignment structures. The memory can store the information specifying where and what type of alignment structures are on the wafers.

In one embodiment, the manufacturer enters information about the pattern of transmission columns associated with a plurality of wafers to be aligned. The information includes the type of transmission columns and the various patterns formed on the wafers. The processor evaluates the information acquired by the alignment circuitry with regard to the patterns stored in memory to determine the type and amount of adjustment to be made.

When designing vertically stacked multichip packages, manufacturers must weigh the benefits of forming wafers of homogenous devices with the possible inefficient use of real estate on each wafer. For example, the amount of memory desired for a specific multichip device may not cover the same amount of area as a processor or MEMS to be included in the multichip device. Therefore, the manufacturer must decide whether or not to form the memory to cover the same area as the processor or MEMS or to leave the space unused. More particularly, the kerf regions between the die of memory will be larger than the kerf regions between die of processors. In some situations, the manufacturer may choose to leave the space unused and thereby avoid the additional costs associated with additional processing. Alternatively, the additional test structures or the alignment circuitry may be formed in the larger kerf regions of the memory.

Figure 3A:
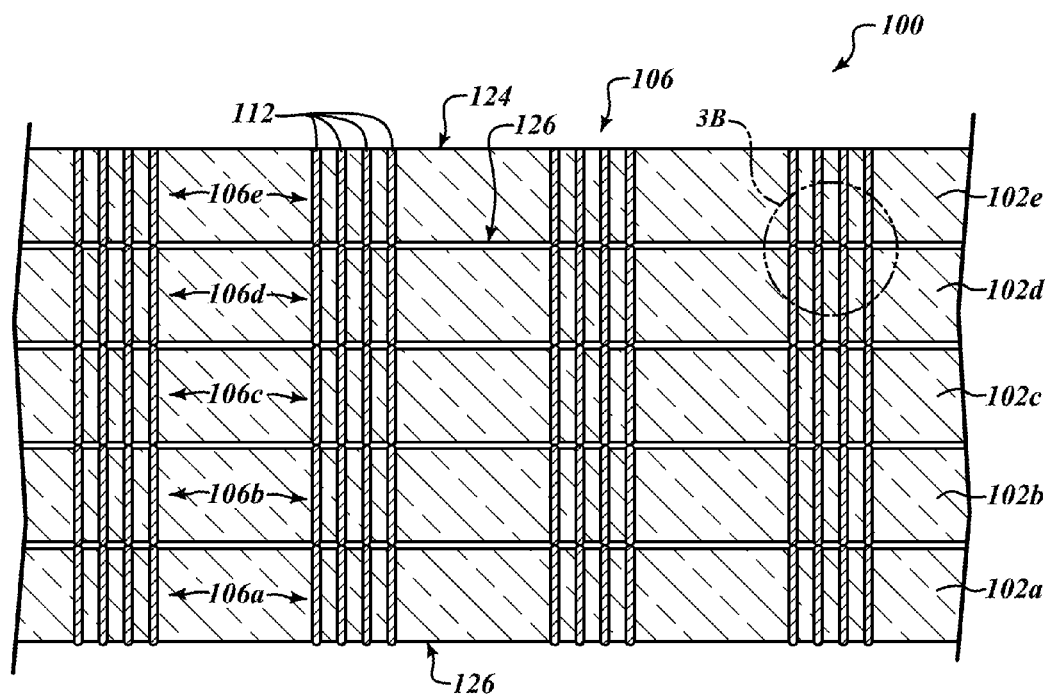
FIGS. 3A-3C are cross-sectional views of wafers having alignment structures according to an embodiment of the present disclosure.

FIG. 3A shows a cross-sectional view of an embodiment of a vertically stacked multichip device 100 having a plurality of alignment structures 106 formed on each wafer 102a-102e. The alignment structures 106 are formed during manufacturing of each individual wafer 102a-102e at identical corresponding locations selected by the manufacturer.

Each alignment structure 106 includes a plurality of transmission columns 112 that extend through each wafer from a first surface 124 to a second surface 126. Precise alignment for each alignment structure 106 is achieved when each transmission column 112 of the first wafer 102a is aligned with a respective one of the transmission columns 112 of the second wafer 102b for a particular alignment structure 106. When all alignment structures 106 are properly aligned, the precise alignment for the entire wafer is achieved.

After all alignment structures 106 on the wafers are aligned, the wafers are bonded to each other. In one embodiment, the bonding is achieved by a dielectric polymer glue that is applied to thinned wafers to create a void free bond. The bonding conditions are selected to be compatible with CMOS (complementary metal oxide semiconductor) processing. Prior to aligning and bonding, the wafers may be thinned by a chemical mechanical polishing or other etch to an etch stop layer, such as an implanted layer, an epitaxial layer, or a buried oxide layer. Alternatively, two wafers may be aligned and bonded and subsequently thinned. Thinning of the wafers results in a final smaller package because an unused portion of the bulk silicon is removed. Methods of bonding thinning are known in the art and will not be described in detail herein.

In the embodiment of FIG. 3A, each of the wafers 102a-102e shows four alignment structures 106 in this cross-section, each having four transmission columns 112 visible. The alignment structures 106 may include any number of transmission columns formed in a pattern. For example, the alignment structure 106 may be a 4×4 array of transmission columns 112. Other patterns and arrangements of transmission columns will be discussed in more detail below.

The transmission columns 112 are electrically or optically conductive. Metal, polysilicon, or other conductive materials may be used to form electrically conductive transmission columns 112. Glass or other materials that allow sufficient light transmission may be used to form optically conductive transmission columns 112. If an electrical conductor is used for the transmission column 112, then electrical equipment is used to test the resistance of the alignment structures from the first surface 124 of the fifth wafer 102e to the second surface 126 of the first wafer 102a. If an optical transmission column is used, then a light source is placed on the first surface 124 of the fifth wafer 102e and a light detector is placed on the second surface 126 of the first wafer 102a. The wafers are moved with respect to each other until the maximum light is received by the optical detector and the wafers are aligned.

Figure 3B:
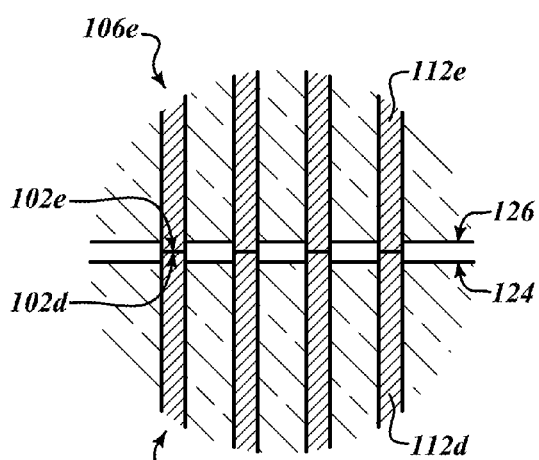

In one embodiment, each transmission column 112 extends past the first and second surface 124, 126 of each wafer by a small distance as illustrated in FIG. 3B. The extension of the transmission columns 112 assists in permitting electrical or optical communication to pass through aligned transmission columns 112 from wafer 102e to wafer 102d. The extension can be very small, for example, in the range of a few microns, to ensure the transmission columns 112 contact each other instead of the wafer surfaces contacting.

Figure 3C:
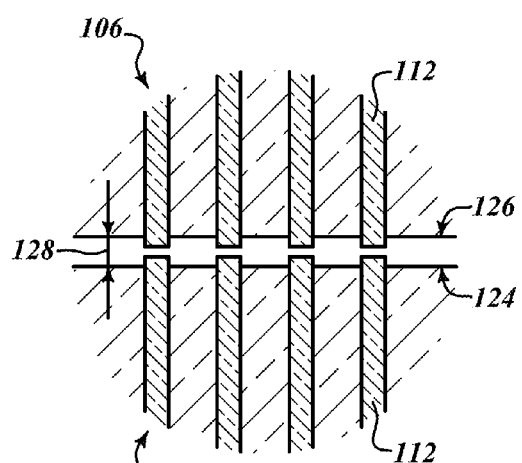

FIG. 3C is an alternative embodiment showing the fourth wafer 102d spaced from the fifth wafer 102e by a distance 128. The transmission columns 112 of the two wafers are not contacting each other. This configuration may be used for the optical transmission described above. Precise alignment is achieved when the maximum light is transmitted through the transmission columns 112 from the fifth wafer 102e through the fourth wafer 102d.

In one embodiment, the distance 128 between the wafers is related to a distance of electrical contact pads or balls in a ball grid array that enable operational electrical communication between devices. The alignment is achieved through precise x-y alignment. The vertical z distance may vary between the wafers depending on the surface characteristics of each wafer.

The alignment structures 106 may be formed in a kerf or scribe region between a plurality of die formed on the wafer. The kerf or scribe region may be 100 microns in size, which provides space to form a variety of the alignment structures in different patterns. The alignment structures 106 may be formed within each die in order to allow for die level alignment. In another embodiment, specific die regions may be designated for alignment and will only contain alignment structures. The various embodiments of the alignment structures and their positioning on the wafers will be discussed in more detail below.

Figure 3D:
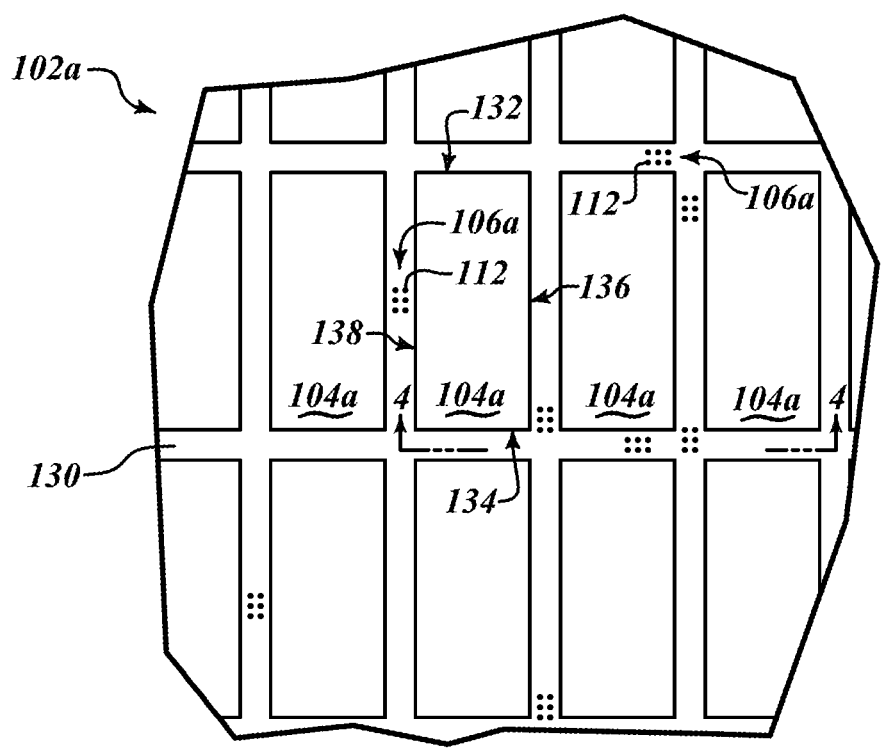
FIG. 3D is a top plan view of a wafer having a plurality of alignment structures.

FIG. 3D is a top view of the wafer 102a having a plurality of die 104a manufactured for vertically stacked integration that include a plurality of alignment structures 106 formed in a kerf 130 between the die 104a. In this embodiment, the alignment structures 106 each include six transmission columns 112 arranged in a 2×3 array. The alignment structures 106 are positioned in a variety of locations to avoid a false positive determination of alignment. If one of the wafers is slightly shifted, the intermittently formed alignment structures 106 prevent incorrect alignment with an adjacent alignment structure.

The die 104a each have a first end 132 and a second end 134 that are transverse to a first side 136 and a second side 138. Some of the alignment structures 106 are positioned in the kerf 130 between the first end 132 of one die 104a and a second end 134 of an adjacent die. Other alignment structures 106 are positioned between the first side 136 of one die and the second side 138 of an adjacent die. Additional alignment structures 106 are positioned in a center of an intersection of kerf regions 130 adjacent corners of four die.

Figure 4:
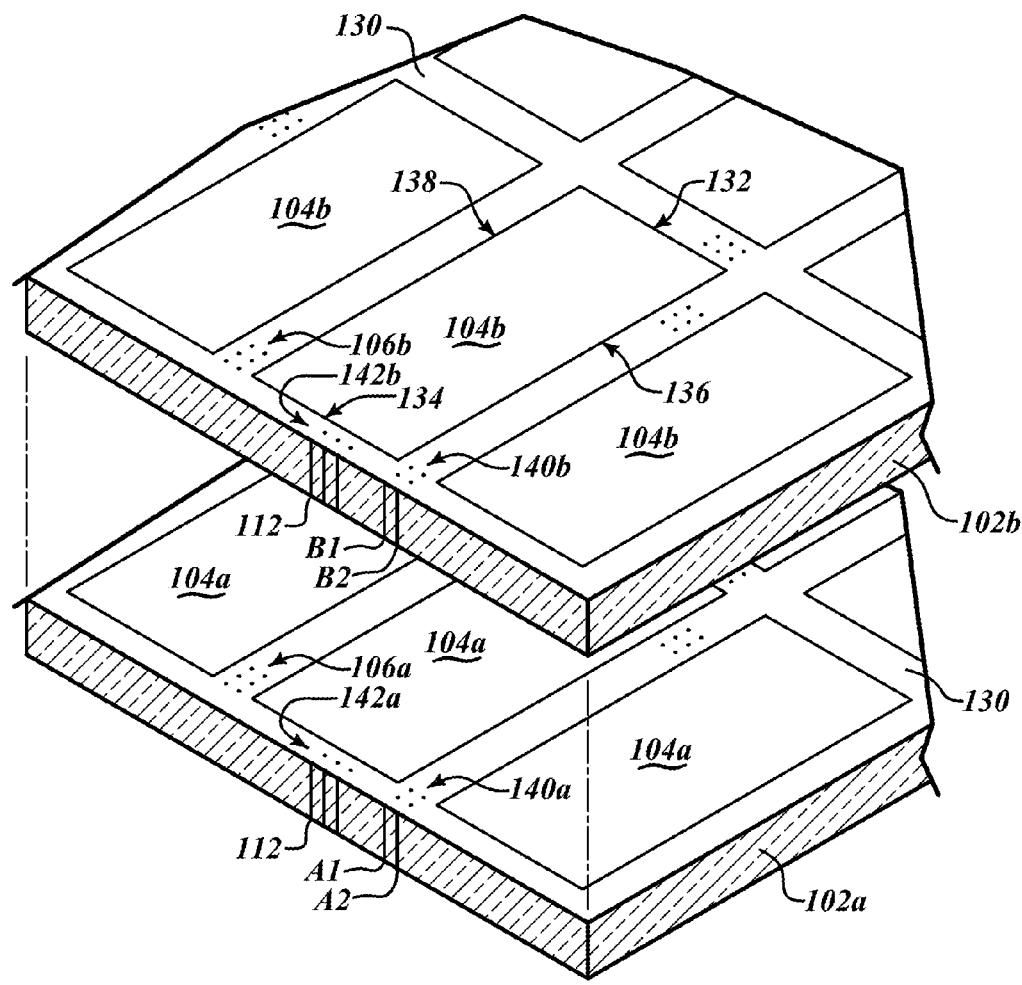
FIG. 4 is an isometric view of a cross-section taken through 4-4 of FIG. 3D for two wafers to be bonded.
Figure 5:
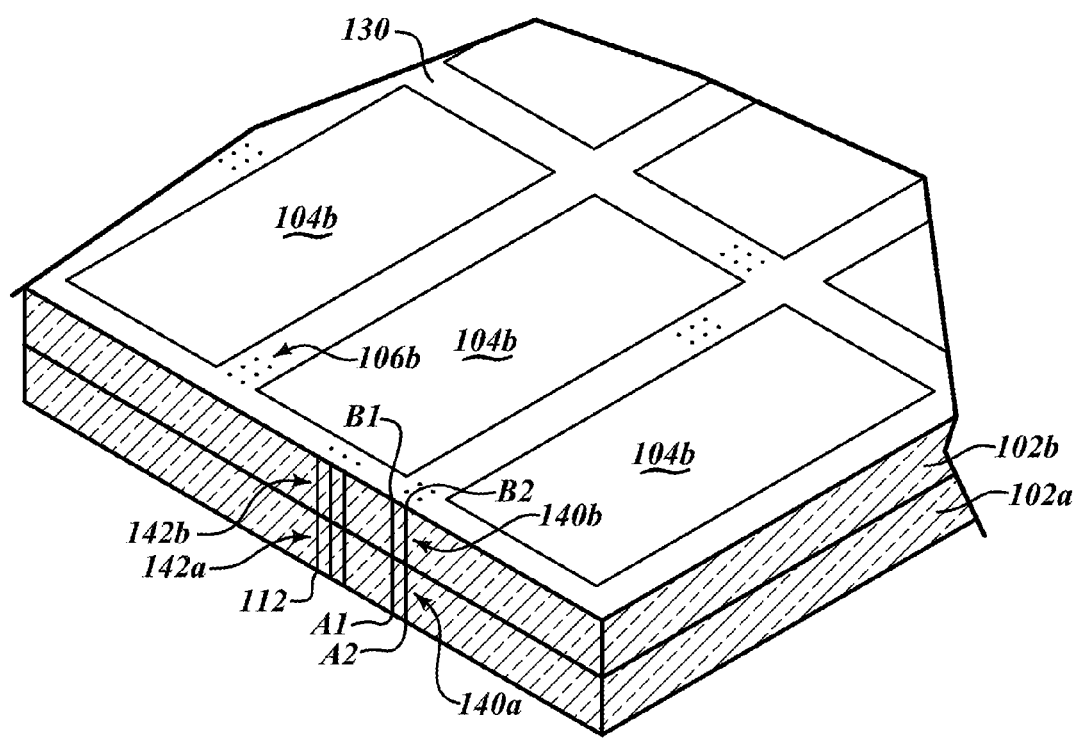
FIG. 5 is an isometric view of the two wafers of FIG. 4 after alignment and bonding.

FIGS. 4 and 5 are isometric views of a cross-section taken through the first wafer 102a and the second wafer 102b having alignment structures positioned as illustrated in FIG. 3D. The second wafer 102b includes the plurality of die 104b separated by the kerf or scribe line 130. Each die includes the first end 132, the second end 134, the first side 136, and the second side 138. The plurality of alignment structures 106 are positioned on the second wafer 102b in the same arrangement as described above in FIG. 3D.

The cross-section is taken through two alignment structures 140 and 142, which are both 2×3 arrays of transmission columns 112. The transmission columns 112 extend from the first surface 124 to the second surface 126 of each wafer. In this embodiment, both the second wafer 102b and the first wafer 102a are thinned prior to alignment. In an alternative embodiment, the first wafer 102a may be thinned after alignment and bonding with the second wafer 102b.

The first wafer 102a includes alignment structures 140a and 142a positioned in a location that corresponds to the alignment structures 140b and 142b of the wafer 102b. The die 104a and the alignment structures of the first wafer 102a are the same size and shape as the die 104b and alignment structures of the second wafer 102b. Shown in FIG. 5, the alignment structures 140b and 142b are perfectly aligned with the alignment structures 140a and 142a of the first wafer 102a. Once alignment is achieved, the wafers are bonded, diced, and packaged to form multichip single packages.

The die 104b of the second wafer 102b and the die 104a of the first wafer 102a may form different devices that are traditionally difficult to integrate into a single package. The manufacturer designs the devices to be in electrical communication once the second wafer 102b and the first wafer 102a are aligned.

In an alternative embodiment, the alignment circuitry is configured to individually probe each column. Two transmission columns A1, A2 of the alignment structure 140a on the first wafer 102a correspond to two transmission columns B1, B2 of the alignment structure 140b on the second wafer 102b. Once the transmission columns A1 and B1 are aligned, the alignment circuitry can probe the A1, B1 pair and detect a resistance. Subsequently, the alignment circuitry can probe the A1, B2 pair. If the wafers are not correctly aligned, the alignment circuitry might detect some amount of current through the A1, B2 pair. Slight adjustments may be automatically made by the alignment circuitry until no current passes through the A1, B2 pair. The testing of an aligned pair of transmission columns and the adjacent transmission column provides for more accurate alignment of the wafers.

Figure 6A:
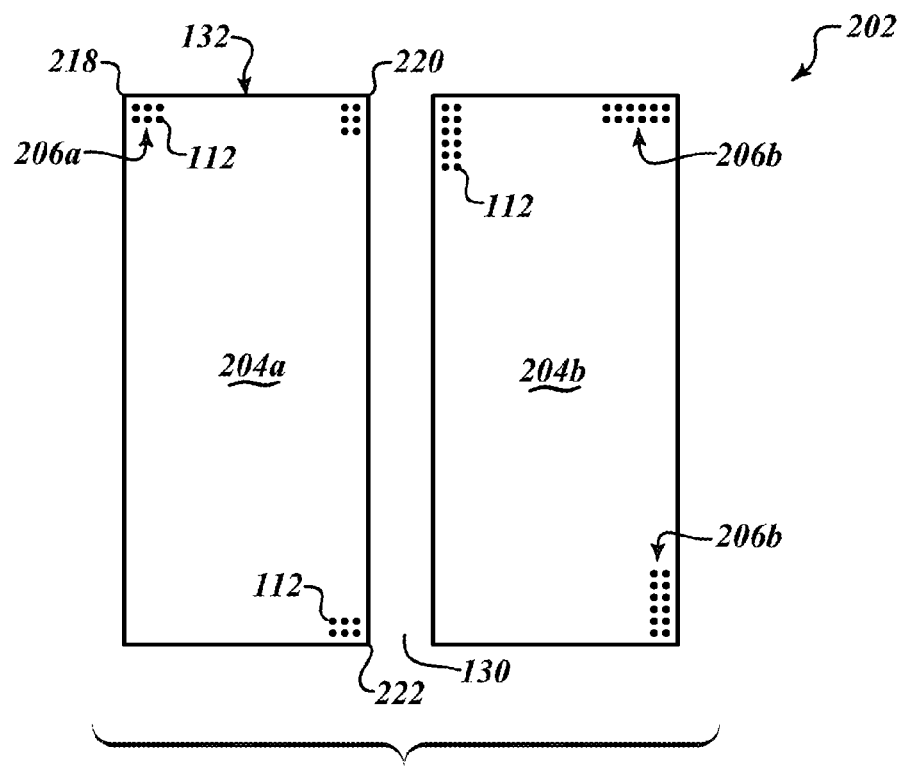
FIGS. 6A and 6B are a top plan view and an isometric view, respectively, of a plurality of die aligned with a plurality of alignment structures.

FIG. 6A is a top down view of a wafer 202 showing another alternative embodiment of alignment structures 206a and 206b formed within each die 204a and 204b instead of in the kerf 130. Forming the alignment structures 206 in each die 204 provides manufacturers with flexibility for when to perform the alignment, wafer level or die level. In this embodiment, adjacent die include different numbers of transmission columns 112 in different patterns.

The alignment structures 206a are formed in the 2×3 array discussed above. However, the alignment structures 206b are formed in a 2×6 array. The different patterns formed on adjacent die 204a and 204b prevent incorrectly aligning adjacent die. Other patterns may be used for a plurality of adjacent die to ensure that a shift of one die with respect to another die does not indicate alignment has been achieved.

The transmission columns 112 of the three alignment structures 206a formed on the die 204a are located in a first corner 218, a second corner 220, and a third corner 222. The transmission columns 112 in the first corner 218 and the third corner 222 are positioned so three of the transmission columns are parallel to the first end 132 and the second end 134, respectively. In contrast, the transmission columns 112 in the second corner 220 are positioned so three of the transmission columns 112 are parallel to the first side 136. The difference in orientation of the alignment structures is also presented on the second die 204b.

Including at least three non-symmetrical alignment structures 206a and 206b in each of the die 204a and 204b is another precaution that can assist in preventing false alignment. For example, if a first die and a second die are to be aligned, but the first die is rotated 180 degrees with respect to the second die, the alignment structures 206a that should align in the second corner 220 will not be in communication. More particularly, the second corner 220 of the first die will overlie a corner of the second die that does not include any transmission columns.

Figure 6B:
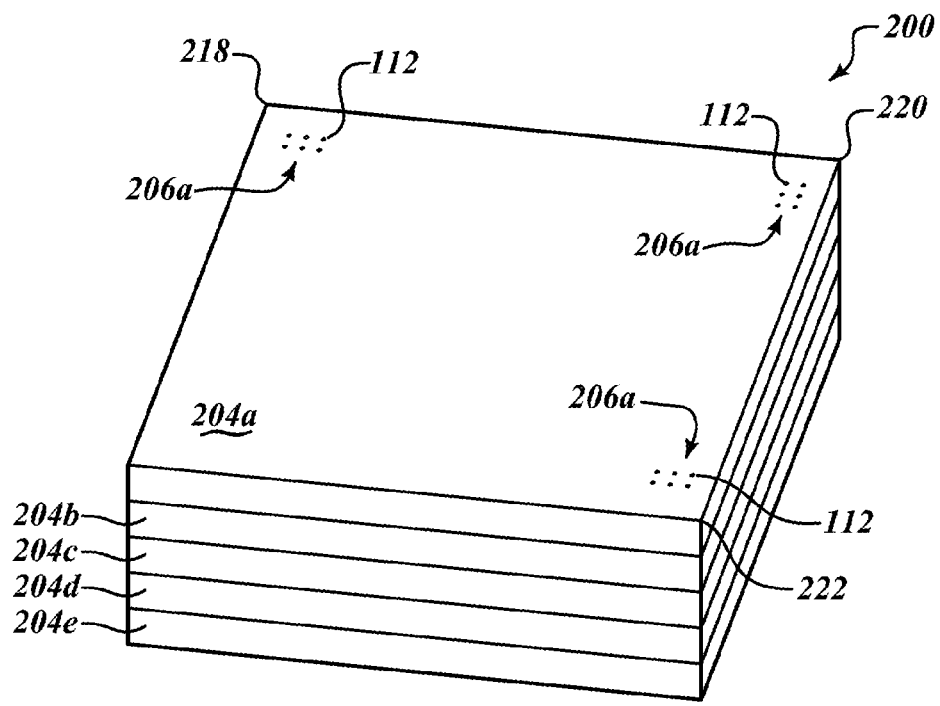

FIG. 6B is a complete stack 200 of five die 204a-204e formed in accordance with the configuration of the die 204a of FIG. 6A. In this embodiment, the alignment structures 206a form the 2×3 array of transmission columns 112 in the first orientation in the first and third corners 218 and 222. The other 2×3 array of transmission columns 112 is in a second orientation that is rotated 90 degrees with respect to the first orientation in the second corner 220.

Figure 7:
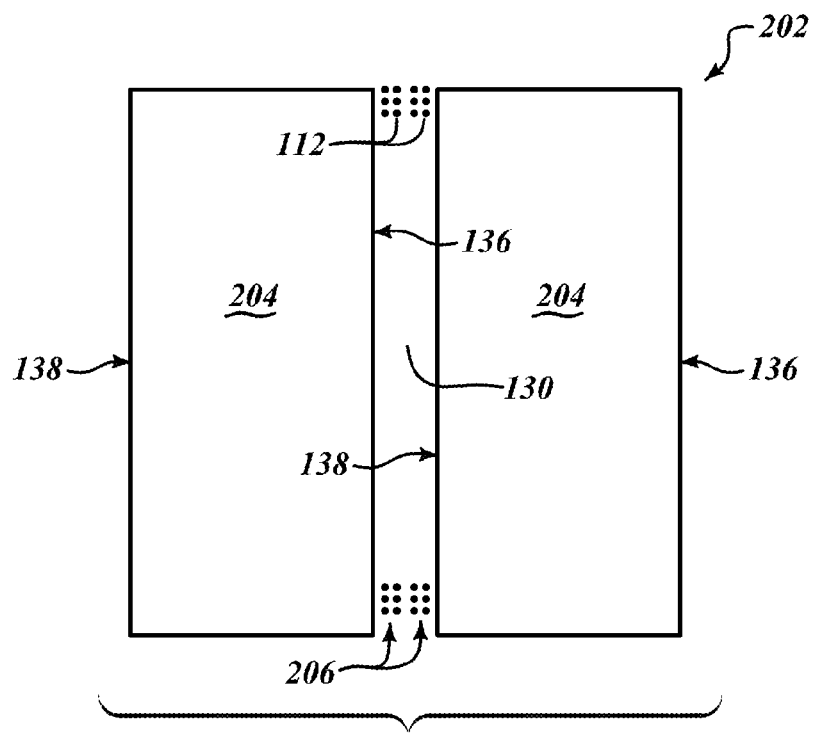
FIG. 7 is a top plan view of die showing positions of alignment structures in the kerf between die.

FIG. 7 is an alternative embodiment of the alignment structures 206 positioned in the kerf 130 between two die 204. The transmission columns 112 are more tightly packed than in FIG. 6A. The tighter arrangement allows two 2×3 arrays to be formed side by side in the kerf 130 between the two die 204. The pattern of two 2×3 arrays formed between the first side 136 of one die and the second side 138 of the other die may be repeated at various locations on the wafer to avoid incorrect alignment.

Figure 8:
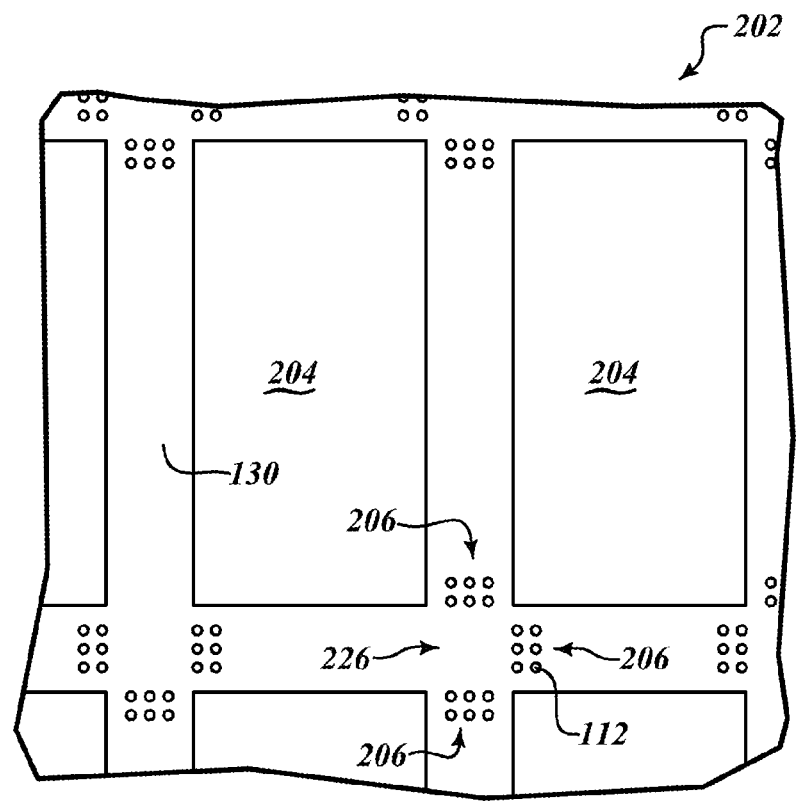
FIG. 8 is a top plan view of a wafer showing positions of alignment structures in the kerf between die according to another embodiment of the present disclosure.

FIG. 8 illustrates an alternative embodiment of the wafer 202 having the plurality of die 204 separated by the kerf 130. The plurality of alignment structures 206 are formed in the kerf 130 and are configured to align a plurality of wafers to make a vertically stacked wafer level stack. In this embodiment, the alignment structures 206 include six transmission columns 112 formed in a 2×3 array.

In this embodiment, a pattern 226 includes three alignment structures 206 positioned in the intersection of transverse kerf regions 130. The pattern 226 is repeated in each intersection of kerf regions in different orientations, which are shifted from each other by 90 or 180 degrees. This is another alternative arrangement that assists in preventing false alignment.

Figure 9:
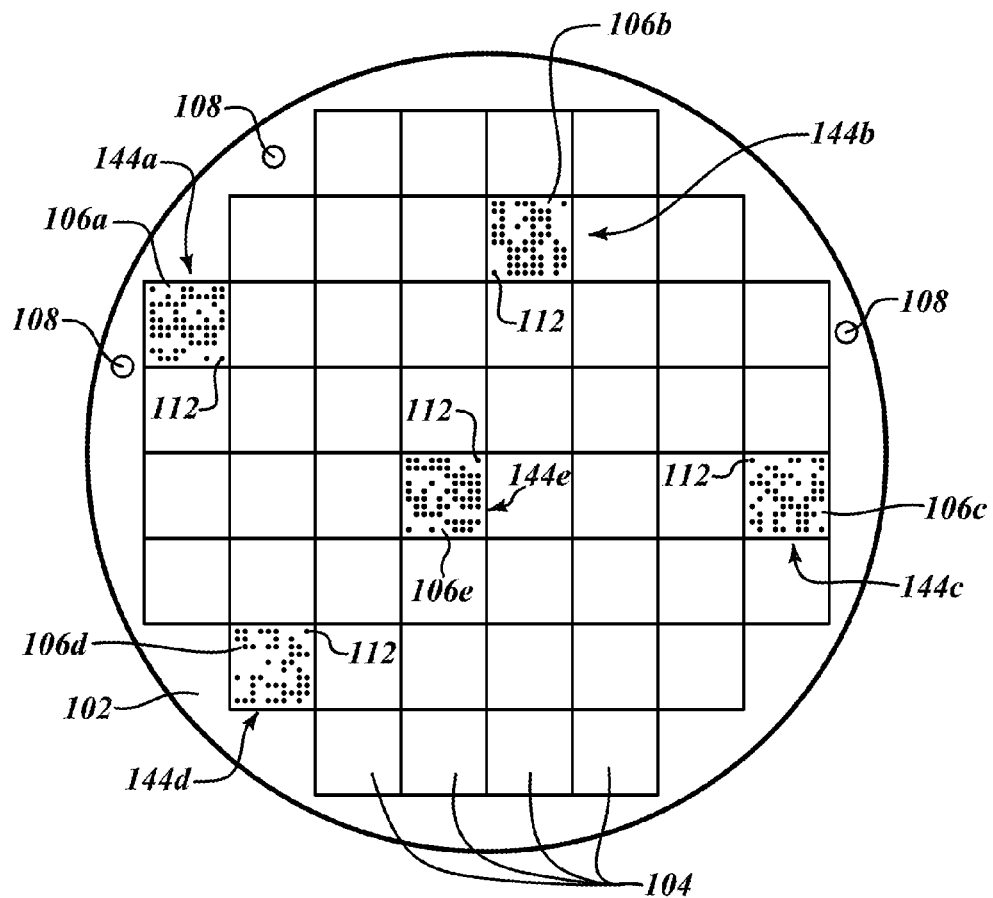
FIG. 9 is a top plan view of a wafer having a plurality of alignment die spaced intermittently on the wafer according to yet another embodiment of the present disclosure.

FIG. 9 is an alternative embodiment of the wafer 102 having a plurality of die 104 formed thereon. Instead of having a plurality of alignment structures formed in a kerf region, a plurality of die regions are designated to be alignment die 106a-106e. Each of the alignment die 106 includes a plurality of transmission columns 112 formed in a pattern. In this embodiment, there are five different alignment die 106 intermittently positioned across the wafer, each having a different pattern of transmission columns 112.

A first pattern 144a of the transmission columns 112 is formed through the alignment die 106a. This alignment die 106a is formed at an exterior edge of the die region of the wafer 102. A second pattern 144b of the transmission columns 112 is formed in the alignment die 106b. This alignment die 106b is formed in a second row of die on the wafer 102. The first pattern 144a and the second pattern 144b have a different number of transmission columns that are arranged differently, which ensures there is no chance of incorrect alignment of this wafer with an additional wafer. Accordingly, the additional alignment die 106c, 106d, 106e also have different patterns 144c, 144d, 144e, respectively. Each of the alignment die are formed in locations of the wafer 102 that are distinct from each of the other alignment die 106 so that if one wafer is shifted 90 or 180 degrees with respect to another wafer, incorrect alignment will not occur. In addition, if one of the wafers to be stacked is shifted by some amount, the alignment die 106 will not falsely align.

As described above, gross alignment of a plurality of wafers 102 may be achieved by an automated system that aligns gross alignment structures 108. The gross alignment structures 108 may be large holes formed through each wafer is non-symmetrical positions. Three gross alignment structures 108 are formed on the wafer 102, however, any number of gross alignment structures 108 may be formed.

Figure 10A:
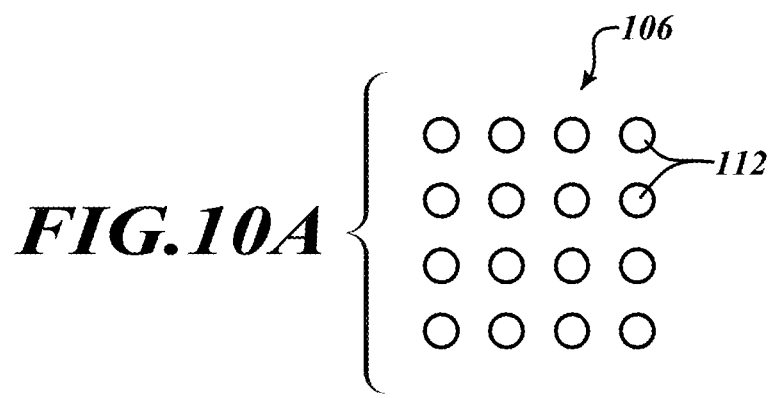
FIGS. 10A-10D are top plan views of various patterns and types of transmission columns of alignment structures according to the present disclosure.

FIGS. 10A-10D illustrate alignment structures formed having a plurality of transmission columns 112 in a variety of different patterns. In addition, the transmission columns 112 may be formed in different sizes and shapes, with different materials, and spaced in different ways. For example, FIG. 10A illustrates an alignment structure 106 that includes a 4×4 array of transmission columns 112. The transmission columns 112 are evenly spaced from each other to make a square shape.

Figure 10B:
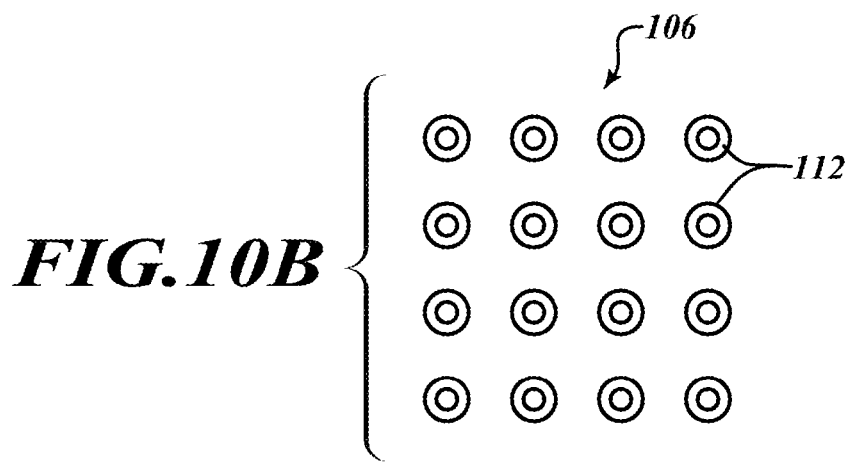

FIG. 10B illustrates another alignment structure 106 having a plurality of transmission columns 112 formed to be annular rings. The rings may be metal or other conductive material. The transmission columns 112 are also spaced evenly and form a 4×4 square pattern. This alignment structure 106 may be formed in the kerf region or within a plurality of die. Alternatively, as described above, the alignment structures 106 may be formed in a die region designated for alignment purposes. Designating several die regions for alignment purposes prevents the kerf region from being cluttered with alignment structures and provides space for test structures to be formed.

Figure 10C:
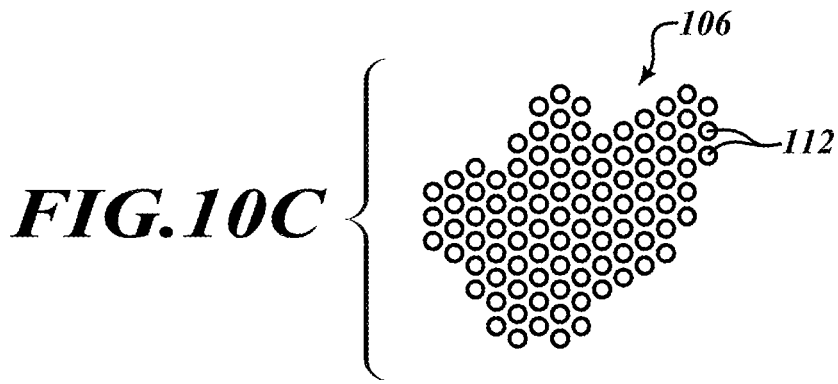

FIG. 10C illustrates an alternative pattern for an alignment structure 106 that includes a plurality of transmission columns 112. In this embodiment, the plurality of transmission columns 112 are formed in an irregular pattern and spaced by a small distance. The irregular pattern of the alignment structure 106 decreases the chance of false alignment, where the transmission columns are all transmitting the signal through both wafers, but the wafers are not actually correctly aligned.

Figure 10D:
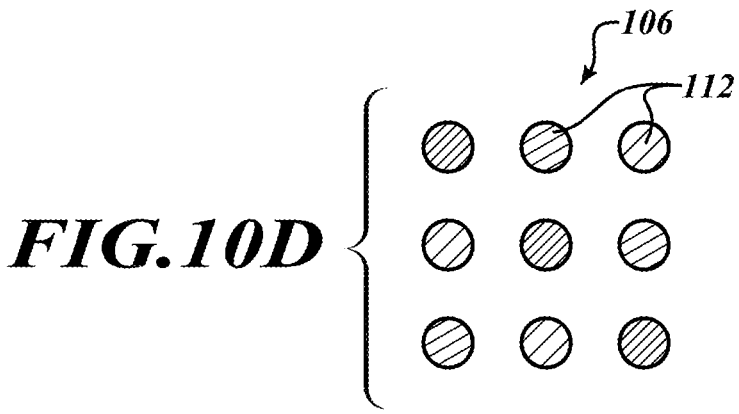

FIG. 10D illustrates an alternative embodiment of transmission columns 782 in an alignment structure 106 where the transmission columns 782 are formed from different conductive materials having different resistance values. For example, one column 112 may have a resistance of 5 ohms, where an adjacent column has a resistance of 50 ohms. Other columns in the alignment structure 106 may have a resistance of 5 k ohms. In one embodiment, the transmission columns have resistance values that differ from each other by factors of 5 or 10.

The alignment structure 106 is a 3×3 array of the transmission columns 112 that also form a square pattern. The different types of metals will result in different resistances detected through the transmission columns when they are aligned. Therefore, the alignment circuitry can use the variations in resistance as another factor to evaluate to determine the adjustments to make. The variations of materials and patterns are provided for illustrative purposes and other variations may be utilized in accordance with the present disclosure.

FIG. 11 is a cross-section of a vertically stacked structure 300 having a plurality of capacitive alignment structures 306 according to an alternative embodiment of the present disclosure. The capacitive alignment structures 306 are formed on four wafers 302a-302d that have been aligned and bonded to form the vertically stacked structure 300. The alignment may be achieved at the wafer level or at the die level.

In this embodiment, each wafer may have a different pattern of alignment structures 306 on a first and second surface. For example, the wafer 302b has a first pattern 314b adjacent a first surface 324 and a second pattern 316b adjacent a second surface 326. The first wafer 302a adjacent the second wafer 302b has the first pattern 314a of alignment structures 306 that are in the same formation as the first pattern 314b. In addition, the wafer 302c adjacent the second wafer 302b has the second pattern 316c of alignment structures 306 that are in the same formation as the second pattern 316b.

Each alignment structure 306 includes a first and a second capacitive plate formed on a first and a second wafer, respectively. More particularly, the wafer 302a includes three capacitive plates 318a, 320a, and 322a formed adjacent the first surface 324 of the wafer 302a that is facing the second surface 326 of the wafer 302b. Each of the capacitive plates 318a, 320a, and 322a forms one plate of each of the capacitive alignment structures 306 of the first pattern 314a, 314b. Three capacitive plates 318b, 320b, and 322b formed adjacent the second surface 326 of the wafer 302b correspond with the three capacitive plates 318a, 320a, and 322a of the wafer 302a to form the alignment structures 306 of the first pattern 314.

The second pattern 316b and 316c of alignment structures 306 is formed between the wafers 302b and 302c. Incorrect alignment or false alignment is avoided by including different patterns of alignment structures on opposing sides of each wafer. The capacitive alignment structures do not extend from the first or second surface of each wafer. The wafers can be thinned prior to alignment and bonding without damaging the alignment structures or affecting the accuracy of alignment.

Once the wafers are formed having the specific patterns of capacitive alignment structures, alignment is achieved by maximizing the capacitance between capacitive plates of the individual alignment structures. For example, if the wafer 302b is shifted with respect to the wafer 302a, a capacitance detected between the capacitive plates 318a and 318b of the wafers 302a and 302b will be lower than if the capacitive plates are aligned.

As with the transmission columns, a similar complexity of patterns can be achieved with the capacitive plates. In addition, the wafers having capacitive alignment structures may be positioned to have a distance between the wafers as shown in FIG. 3C. The distance may relate to a size of the bonding or contact pads that are used to electrically connect the multiple die for operation. The wafers may be separated by air or by a dielectric bonding substance. The capacitive alignment structures have the further advantage that circuits can be formed on the same wafer or die that interface with the capacitors and provide an indication of alignment. Circuits on the same die that sense capacitive value can easily be formed using known techniques. When the capacitance reaches a desired value, the on chip circuit can output a matching signal indicating that the wafers or die are now properly aligned.

Figure 12:
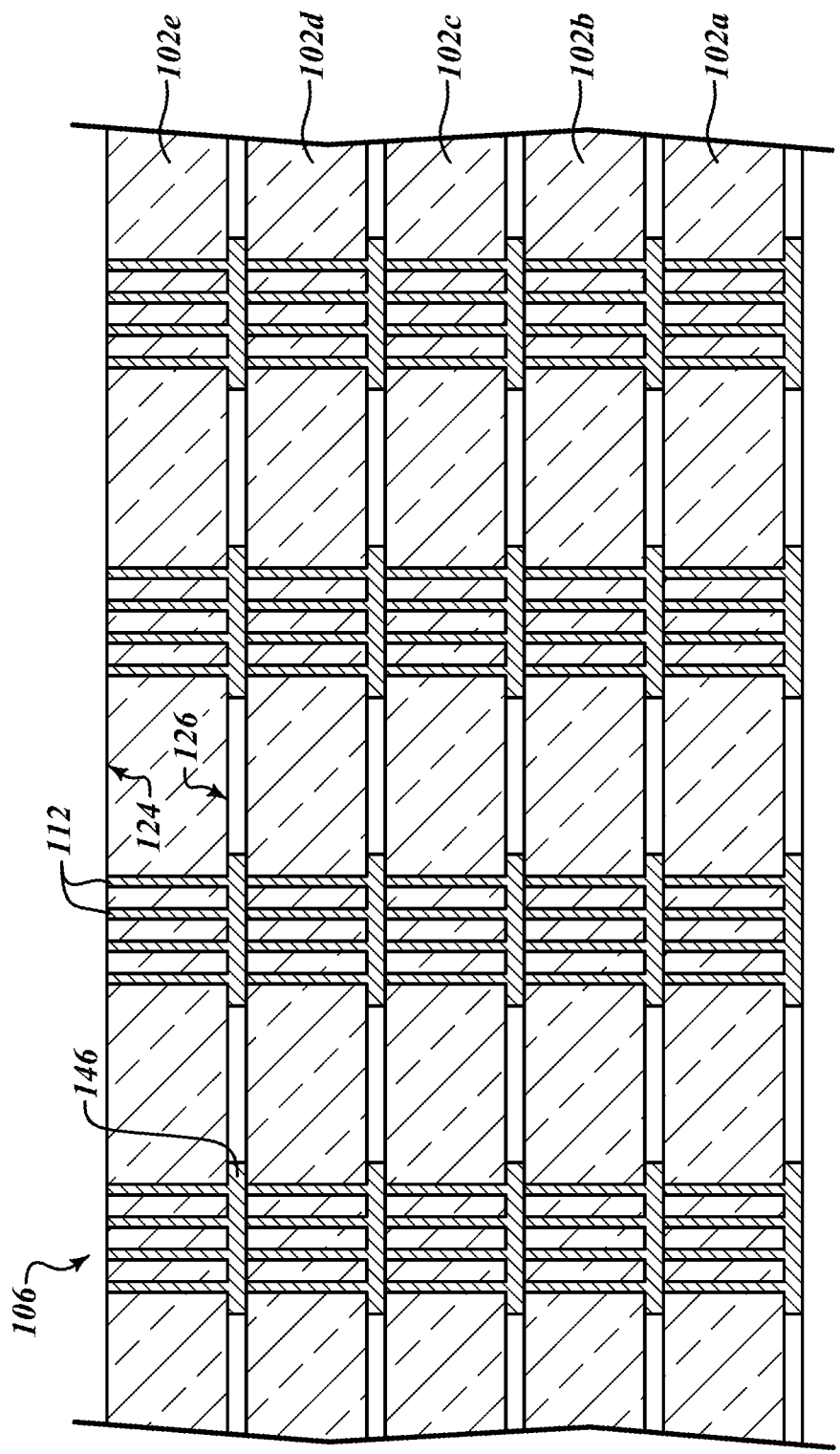
FIG. 12 is a cross-sectional view of alignment structures coupled to alignment pads according to an embodiment of the present disclosure.

FIG. 12 is a cross-sectional view of an alternative embodiment of the vertically stacked structure 100 having the plurality of alignment structures 106 configured to align the plurality of wafers 102a-102e. Each alignment structure 106 includes a plurality of transmission columns 112 formed through each wafer, in electrical communication with an alignment pad 146 that is formed on the second surface 126 of each wafer 102. The pad 146 is in contact with each transmission column 112 of one alignment structure 106.

Figure 13:
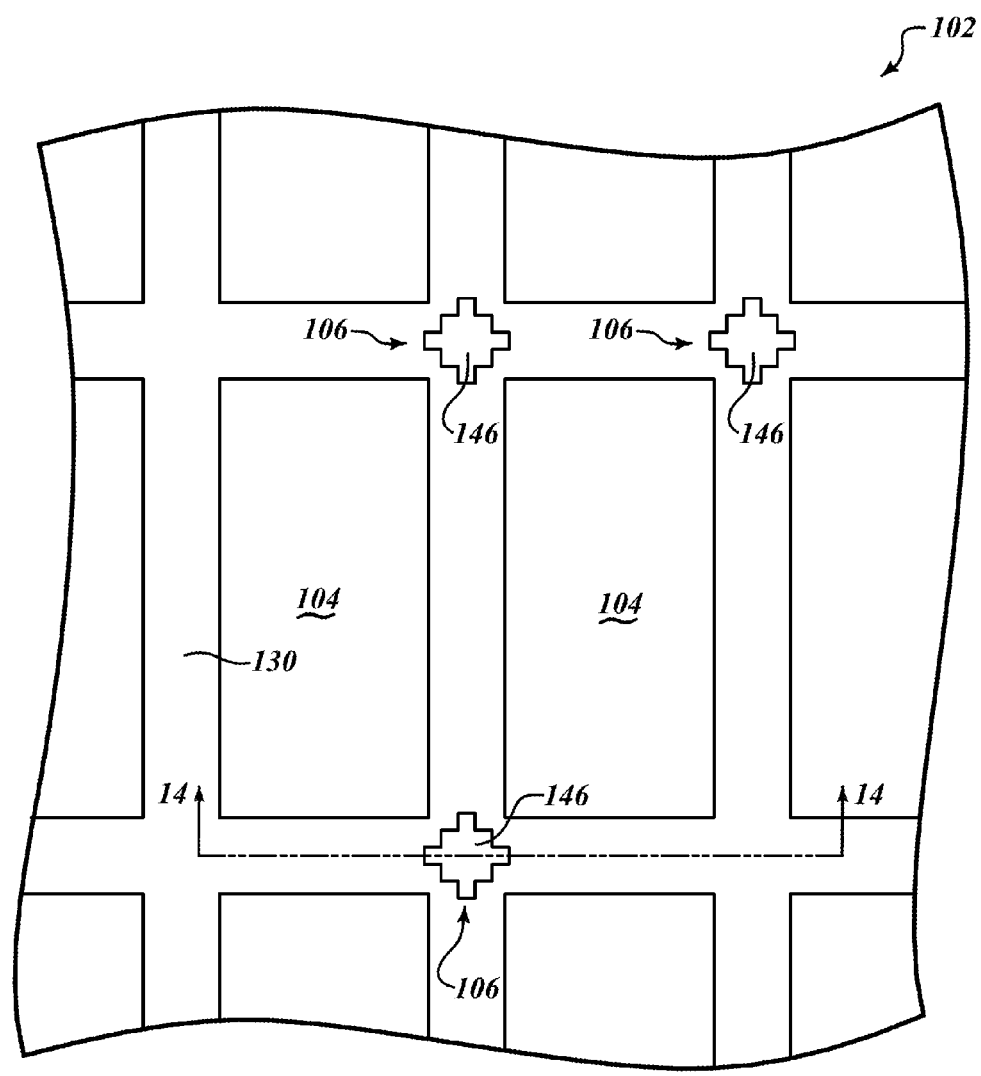
FIG. 13 is a top plan view of a plurality of alignment pads on the wafer in accordance with an embodiment of the present disclosure.
Figure 14:
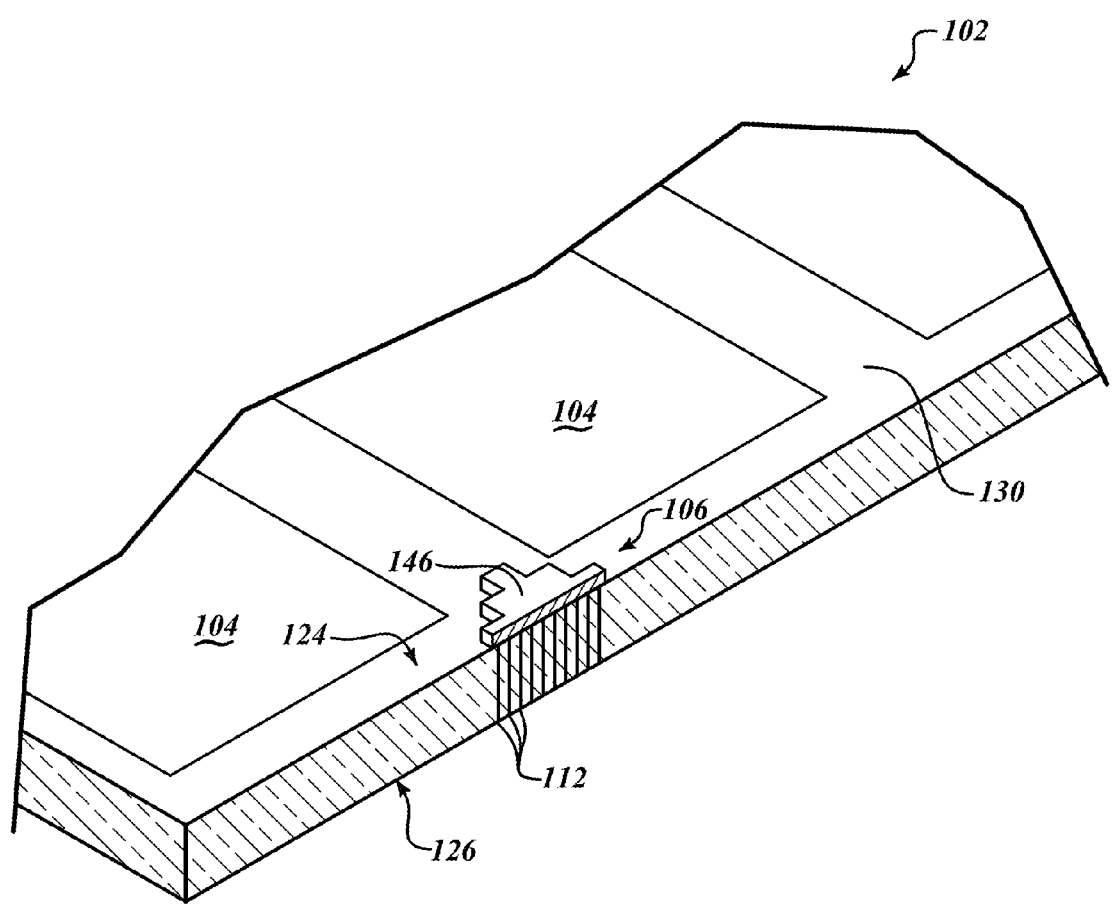
FIG. 14 is an isometric view of a cross-section taken through 14-14 of FIG. 13 of one of the alignment pads illustrated in FIG. 13.

FIGS. 13 and 14 illustrate an alternative embodiment showing the plurality of alignment structures 106 having alignment pads 146 formed on the wafer 102. FIG. 13 is a top down view of the plurality of alignment structures 106 formed at various locations between the plurality of die 104 on the wafer 102. The alignment structures 106 include the plurality of transmission columns 112 formed through the wafer 102 that are in electrical communication with the alignment pad 146.

The alignment pad 146 is sized and shaped to correspond to a pattern of the transmission columns 112. The alignment pads 146 and the corresponding transmission columns 112 are formed intermittently across a wafer to avoid incorrect alignment. The alignment pads 146 are a thin electrically or optically conductive material.

In one embodiment, the transmission columns 112 are formed through each wafer from the top surface 124 to the bottom surface 126. If the wafers are thinned, the alignment pads 146 may be formed after the thinning process in order to avoid inadvertent damage to the pads 146. The pads also provide a surface for the transmission columns 112 to interact with to ensure electrical or optical communication through two or more wafers. In addition, if one of the transmission columns is damaged during thinning or improperly formed, the alignment pad will still make contact with other transmission columns and provide the transmission needed for alignment.

FIG. 14 is a cross-section of FIG. 13 through 14-14. The alignment structure 106 includes the plurality of transmission columns 112 formed through the wafer 102 and the alignment pad 146 in communication with the transmission columns. In this embodiment, the alignment structures are formed in the intersection of kerf regions 130. As described above, the alignment structures may be formed in the kerf region or in the die at a variety of locations selected by the manufacturer. The alignment pads 146 may be also be used as the electrical connection for operation as well as for alignment.

In addition to providing for alignment of wafers, the alignment structures 106 described herein aid in heat dispersion in the chip packages. The transmission columns that remain after dicing the wafers may act as a heat sink that dissipates heat away from the active areas.

The use of these densely arranged transmission columns also improve planarization results when ultra-low k (ULK) dielectrics are used. Ultra-low k dielectrics are used to overcome device speed limitations. In some embodiments, the ultra-low k replaces silicon dioxide in regions of the wafers. Ultra-low k can have a 50% lower dielectric constant than silicon dioxide. The ultra-low k can reduce parasitic capacitance, increase switching speeds, and lower heat dissipation by improving density and introducing porosity into the wafer.

For example, the ultra-low k can erode in areas between transmission columns during a chemical mechanical polish. One embodiment that improves ultra-low k loss during chemical mechanical processing, is forming the columns to have a width separated from each other by a distance, where the width and the distance are equal. More particularly, a one to one ratio of column width to distance between the columns results in the least amount of ultra-low k loss during planarization. The improved planarization also improves wafer to wafer adhesion because of the improved surface quality.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A method of aligning a plurality of die, comprising:
positioning a first die having a first plurality of alignment structures overlying a second die having a second plurality of alignment structures, the first plurality of alignment structures having a first plurality of transmission columns arranged in a first pattern having a position of each one of the first plurality of transmission columns set with respect to each other and the second plurality of alignment structures having a second plurality of transmission columns arranged in a second pattern having a position of each one of the second plurality of transmission columns set with respect to each other, the first pattern being the same as the second pattern, the first and the second die being in direct physical contact;

applying a first signal to the first plurality of alignment structures;

detecting a second signal at the second plurality of alignment structures;

determining a difference between the first and second signals; and adjusting a position of the first die with respect to the second die to decrease the difference between the first and second signals.

2. The method of claim 1 wherein applying the first signal and detecting the second signal include applying the first signal to a first end of each of the first transmission columns and detecting the second signal at a second end of each of the second transmission columns, a second end of each of the first transmission columns in electrical communication with a first end of each of the second transmission columns.

3. The method of claim 2 wherein determining the difference between the first and second signals includes determining a resistance between the first end of each of the first transmission columns and the second end of each of the second transmission columns.

4. A method, comprising:
forming a plurality of first transmission columns in a first wafer, the first transmission columns arranged in a first pattern having a position of each one of the first transmission columns set with respect to each other;
forming a plurality of second transmission columns in a second wafer, the second transmission columns arranged in a second pattern having a position of each one of the second transmission columns set with respect to each other, the first pattern being the same as the second pattern;
aligning the first wafer with the second wafer by directly physically contacting the plurality of first transmission columns to the plurality of second transmission columns and matching the first pattern with the second pattern, the aligning including:
applying a signal to the first transmission columns;
detecting the signal at the second transmission columns; and
adjusting a position of the first wafer with respect to the second wafer to more precisely align the pattern.

5. The method of claim 4 wherein the aligning includes determining a difference between a first value of the signal applied to the first transmission columns and a second value of the signal detected at the second transmission columns.

6. The method of claim 5 wherein adjusting the position includes decreasing the difference between the first and second values.

7. The method of claim 4 wherein applying the signal includes applying an optical signal to an end of at least one of the first transmission columns.

8. The method of claim 7 wherein detecting the signal includes detecting the optical signal passing through the at least one of the first plurality of alignment structures at an end of one of the second plurality of alignment structures.

9. The method of claim 4 wherein forming the plurality of first transmission columns includes forming a first end of the first transmission columns extending from a first surface of the first wafer by a first distance.

10. The method of claim 9 wherein forming the plurality of first transmission columns includes forming a second end of the first transmission columns extending from a second surface of the first wafer by a second distance.

11. The method of claim 9 wherein forming the plurality of first transmission columns includes forming the first ends and second ends of the first transmission columns not overlaying any portion of the first and second surface of the first wafer.

12. The method of claim 9 wherein forming the plurality of second transmission columns includes forming a first end of the second transmission columns extending from a first surface of the second wafer by a second distance.

13. The method of claim 12, further comprising arranging the first wafer and the second wafer to have the first end of the first transmission columns facing the first end of the second transmission columns.

14. The method of claim 12 wherein forming the plurality of second transmission columns includes forming a second end of the second transmission columns extending from a second surface of the second wafer by a third distance.

15. The method of claim 4 wherein forming the plurality of first transmission columns includes forming a first one of the first transmission columns from a first material and forming a second one of the first transmission columns from a second material that is different from the first material.

16. A method, comprising:
forming a first alignment column, a second alignment column, and a third alignment column each in a first die, a top side of each of the first, second and third alignment columns being coplanar and a portion of each of the first, second and third alignment columns extending away from a side of the first die;
forming a fourth alignment column, a fifth alignment column, and a sixth alignment column each in a second die, a bottom side of each of the fourth, fifth, and sixth alignment columns being coplanar and a portion of each of the fourth, fifth and sixth alignment columns extending away from a side of the second die.

17. The method of claim 16, wherein the portion of the first alignment column extends out of a top side of the first die and the portion of the fourth alignment column extends out of a bottom side of the second die.

18. The method of claim 16, further comprising:
aligning the first die to the second die, the aligning including:
applying a signal to the first, second, and the third alignment columns; and
reading the signal from the first alignment column at the fourth alignment column, the signal from the second alignment column at the fifth alignment column, and the signal from the third alignment column at the sixth alignment column.

19. The method of claim 16, wherein the first alignment column is formed from a first material, and the second alignment column is formed from a second material, the first material different from the second material.

20. A method, comprising:
forming a first alignment column, a second alignment column, and a third alignment column each in a first die, a top side of each of the first, second and third alignment columns being coplanar and adjacent to a top side of the first die, wherein a first distance between the first alignment column and the second alignment column added to a second distance between the second alignment column and the third alignment column does not equal a third distance between the first alignment column and the third alignment column;

forming a fourth alignment column, a fifth alignment column, and a sixth alignment column each in a second die, a bottom side of each of the fourth, fifth, and sixth alignment columns being coplanar and adjacent to a bottom side of the second die; and aligning the first die to the second die, the aligning including:
 applying a signal to the first, second, and the third alignment columns; and
 reading the signal from the first alignment column at the fourth alignment column, the signal from the second alignment column at the fifth alignment column, and the signal from the third alignment column at the sixth alignment column.

21. The method of claim 18, wherein applying a signal includes applying an optical signal to the first, second, and third alignment columns at a bottom side of the first die, the bottom side of the first die opposite the top side of the first die.

22. The method of claim 20, further comprising:
 aligning the first die to the second die, the aligning including:
  applying a signal to the first, second, and the third alignment columns; and
  reading the signal from the first alignment column at the fourth alignment column, the signal from the second alignment column at the fifth alignment column, and the signal from the third alignment column at the sixth alignment column.

23. The method of claim 20, wherein a portion of the first alignment column extends out of a top side of the first die and a portion of the fourth alignment column extends out of a bottom side of the second die.

* * * * *